United States Patent [19]

Desilets et al.

[11] Patent Number: 5,235,206
[45] Date of Patent: Aug. 10, 1993

[54] VERTICAL BIPOLAR TRANSISTOR WITH RECESSED EPITAXIALLY GROWN INTRINSIC BASE REGION

[75] Inventors: Brian H. Desilets, Wappingers Falls; Chang-Ming Hsieh; Louis L. Hsu, both of Fishkill, all of N.Y.

[73] Assignee: International Business Machines Corporation, Armonk, N.Y.

[21] Appl. No.: 864,743

[22] Filed: Apr. 7, 1992

Related U.S. Application Data

[62] Division of Ser. No. 602,822, Nov. 24, 1990, Pat. No. 5,137,840.

[51] Int. Cl.$^5$ .................. H01L 29/72; H01L 29/06
[52] U.S. Cl. .................. 257/578; 257/583; 257/584; 257/586; 257/588; 257/591
[58] Field of Search .................. 357/34, 35, 55; 257/565, 578, 582, 583, 584, 586, 588, 591

[56] References Cited

U.S. PATENT DOCUMENTS

| | | | |
|---|---|---|---|
| 4,824,799 | 4/1989 | Komatsu | 357/34 |
| 5,077,227 | 12/1991 | Kameyama et al. | 357/34 |
| 5,109,262 | 4/1992 | Kadota et al. | 357/34 |
| 5,118,634 | 6/1992 | Neudeck et al. | 357/34 |
| 5,121,184 | 6/1992 | Huang et al. | 357/34 |
| 5,132,765 | 7/1992 | Blouse et al. | 357/34 |

Primary Examiner—Andrew J. James
Assistant Examiner—Ngan Van Ngo
Attorney, Agent, or Firm—Harold Huberfeld

[57] ABSTRACT

A method of manufacturing a vertical bipolar transistor including the steps of: providing a semiconductor substrate including a first region of a first conductivity type; forming an extrinsic base region of a second conductivity type in the surface of the first region, the extrinsic base region generally bounding a portion of the first region; forming by ion implantation a linking region of the second conductivity type in the surface of the bounded portion of the first region so as to electrically link generally opposing edges of the extrinsic base region through the linking region; forming an insulating spacer over the junction between the extrinsic base region and the linking region so as to generally bound a portion of the linking region within the portion of the first region; etching the surface of the bounded portion of the linking region a short distance into the linking region; forming by epitaxial growth a first layer of semiconductor material of the second conductivity type on the etched surface of the bounded portion of the linking region; heating the semiconductor substrate to form an intrinsic base region at least partially within the first layer and to form an electrical connection between the intrinsic and extrinsic base regions through the linking region; and forming a second region of the first conductivity type in the surface of the intrinsic base region.

5 Claims, 4 Drawing Sheets

VERTICAL BIPOLAR TRANSISTOR WITH RECESSED EPITAXIALLY GROWN INTRINSIC BASE REGION

This application is a division of application Ser. No. 07/602,822, filed Nov. 24, 1990 now U.S. Pat. No. 5,137,840 issued on Oct. 24, 1990.

RELATED APPLICATIONS

The present invention is related to copending U.S. application Ser. No. 405,508, filed Sep. 11, 1989 by Rosenberg et al., and to ser. no. 309,510, filed Feb. 13, 1989 by Harame et al.

1. Field of the Invention

The present invention relates generally to semiconductor devices and more specifically to a vertical bipolar transistor including a recessed, epitaxially grown intrinsic base region.

2. Background of the Invention

In the fabrication of vertical, high performance bipolar transistors, it is generally desirable to provide very shallow intrinsic base regions. Such shallow intrinsic base regions, preferably in the sub-micron dimension range, permit the fabrication of extremely high-frequency transistors: i.e., having speeds in the gigahertz switching range.

The formation of the intrinsic base region in the transistors described above is typically accomplished by diffusion from a gaseous or solid diffusion source, or by ion implantation (I/I). Diffusion tends to be difficult to control, and may result in undesirably thick base regions. Ion implantation, while more controllable than diffusion, also has inherent limitations. Particularly with respect to ion implantation of boron (B) atoms, the thickness of the implanted region is limited by secondary channeling effects. Further, both diffusion and ion implantation are particularly difficult to utilize with transistors having shallow, heterojunction base regions: e.g. silicon-germanium (SiGe) base regions.

A further challenge faced in manufacturing transistors with narrow intrinsic base regions is that of providing a reliable electrical connection to the intrinsic base region. Such connections are typically accomplished through the use of an extrinsic base region—a thick, highly doped region disposed in contact with the edge of the intrinsic (or thin, active) base region. As the intrinsic base region decreases in thickness, the linkup between extrinsic and intrinsic base regions becomes more difficult to reliably establish. One typical fault encountered in making such a linkup is that of the extrinsic base and emitter regions butting so as to cause an unacceptably low base-emitter breakdown voltage.

With respect to the formation of thin, intrinsic base regions, a low temperature, ultra-high vacuum, chemical vapor deposition (UHV/CVD) process is known in the art for forming thin, discretely doped layers of epitaxial silicon. See Meyerson, B., "Low Temperature Silicon Epitaxy by Ultrahigh Vacuum/Chemical Vapor Deposition," Appl. Phys. Lett. 48(12), 24 March 1986, pgs. 797–799. This process has also been used to form SiGe layers, as well as various device regions, including, in certain limited configurations, the base regions of transistors. The process is advantageous for these purposes in that it provides relatively defect-free, thin layers. Intrinsic base regions formed using this process, however, may be particularly difficult to connect with the extrinsic base.

Further known in the art is the use of a linker region for electrically linking an intrinsic base region to an extrinsic base region. A linker region, typically a region more lightly doped than the extrinsic base region, is formed proximate the junction between the extrinsic and intrinsic base regions. The purpose of the linker region is to insure a good electrical connection between the two regions. Linker regions are particularly useful where the spacing between the intrinsic and extrinsic base regions may vary, as, for example, where a sidewall spacer is used to set such spacing.

With respect to linker regions, Sugiyama, M., et al., "A 40 GHz $f_T$ Bipolar Transistor LSI Technology," IEDM 89 221-224, shows a linker region out-diffused from a borosilicate glass (BSG) sidewall spacer, the spacer subsequently functioning as an insulator. The use of BSG as a diffusion source is particularly difficult to control, and thus this process is unlikely to yield high performance transistors.

Japanese Kokai No. 62-293,674 (1987) by Matsushita Electric Industrial Co., Ltd., while not showing linker regions, shows a vertical bipolar transistor wherein an intrinsic base region is formed by implanting ions into a recessed surface intermediate bounding, highly doped, extrinsic base regions. The recessed surface, formed by etching after the extrinsic base regions have been formed, results in the removal of inner portions of the extrinsic base regions. The intrinsic base region is subsequently formed by ion implantation. As discussed above, the use of ion implantation results in an intrinsic base region having a minimum thickness inherent in the process limitations. In the particular structure shown, the extrinsic base region is in direct contact with the emitter region, which will likely result in substantially degraded performance. Further, because the etching of silicon is difficult to control, the basewidth and corner doping profile of the transistor will be difficult to control.

In summary, while high performance, vertical bipolar transistors are known which provide very fast switching speeds, several technical problems need to be addressed in order to continue to advance the art. In particular, the present inventors have recognized the need to provide improved methods of forming ultra-thin intrinsic base regions, and the need to provide reliable electrical connections to such thin intrinsic base regions.

OBJECTS OF THE INVENTION

An object of the present invention is to provide a new and improved high performance, vertical bipolar transistor, and a method of making the same, wherein the transistor has a very thin intrinsic base region and a resultantly high switching speed.

Another object of the present invention is to provide a transistor of the type described above wherein a reliable electrical connection is provided between the intrinsic and extrinsic base regions.

Another object of the present invention is to provide such a transistor wherein the base width is not dependent on an etch step and thus is highly uniform.

Yet another object of the present invention is to provide a transistor of the type described above wherein the doping profile of the intrinsic base region can be tightly controlled.

A further object of the present invention is to provide a transistor of the type described above wherein the base region can be formed using a low temperature process.

Yet another object of the present invention is to provide such a transistor wherein the base region can be formed from heterojunction materials, e.g. SiGe.

Yet a further object of the present invention is to provide a method of fabricating a transistor of the type described above, the method being generally compatible with known processing techniques.

SUMMARY OF THE INVENTION

In accordance with the present invention, there is provided a method manufacturing a vertical bipolar transistor comprising the steps of providing a semiconductor substrate including a first region of a first conductivity type; etching the surface of the first region to form a recess in the first region; forming by epitaxial growth a layer of semiconductor material of a second conductivity type on the etched surface of the first region; heating to form an intrinsic base region of the second conductivity type at least partially within the layer of semiconductor material; and forming a second region of the first conductivity type in the surface of the intrinsic base region.

In accordance with another aspect of the present invention, there is provided a vertical bipolar transistor comprising: a semiconductor substrate including a first device region of a first conductivity type; a recess in the surface of the first device region; an epitaxial layer disposed in the recess; an intrinsic base region of a second conductivity type disposed at least partially within the epitaxial layer; and a second device region of the first conductivity type disposed in the surface of the epitaxial layer and contained entirely within the intrinsic base region.

DESCRIPTION OF THE DRAWINGS

These and other objects, features, and advantages of the present invention will become apparent upon a consideration of the following detailed description of the invention when read in conjunction with the drawing Figures, in which.

DETAILED DESCRIPTION OF THE INVENTION

Figure 1:
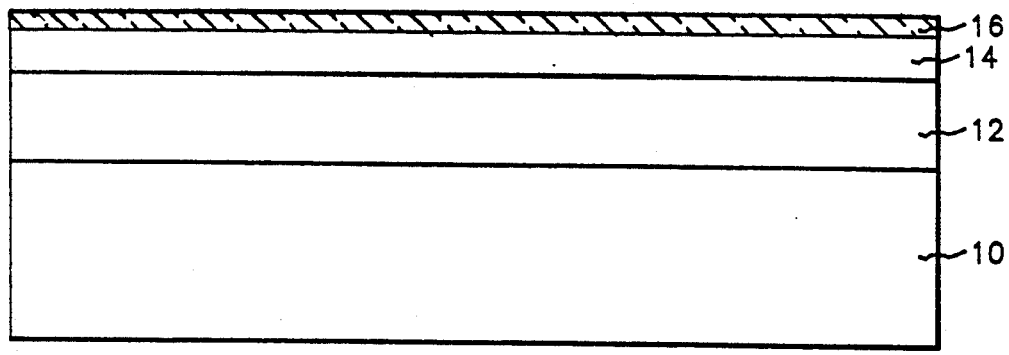
FIGS. 1-9 are cross-sectional views showing consecutive steps in the fabrication of a vertical bipolar transistor in accordance with the present invention.

Referring now to FIG. 1, a P− silicon substrate 10 is provided from a conventional crystal melt having, for example, a crystallographic orientation of <100>, and a sheet resistivity in the range of 10-20 ohm-cm. It will be understood that "N" and "P" are used herein to denote semiconductor dopant types, while "+" and "−" are used where appropriate to indicate relative doping concentrations. It will further be understood that, while the invention is illustrated with respect to silicon regions of particular conductivity types, different semiconductor materials and other conductivity types can be substituted therefor.

Continuing to describe FIG. 1, a layer 12 of N+ silicon is formed over substrate 10 to a thickness of 2.0 micrometers ($\mu$m). A layer 14 of N− epitaxial silicon is formed over layer 12 to a thickness of 1 $\mu$m. Layers 12 and 14 can be fabricated, for example, by first doping the upper surface of substrate 10 heavily N+. A high temperature (i.e., 1100° C.) anneal is performed, and an N− epitaxial silicon layer is grown over this same surface of substrate 10 using a conventional epitaxy process. Using such a process, the dopant in the surface of substrate 10 diffuses further downward into the substrate, as well as upward into the epitaxial layer, to provide the structure shown in FIG. 1.

Still with reference to FIG. 1, a layer 16 of silicon dioxide ($SiO_2$, also referred to as an oxide) is formed over layer 14 to a thickness of 200 nanometers (nm). Oxide layer 16 can be formed by thermal oxidation.

Figure 2:
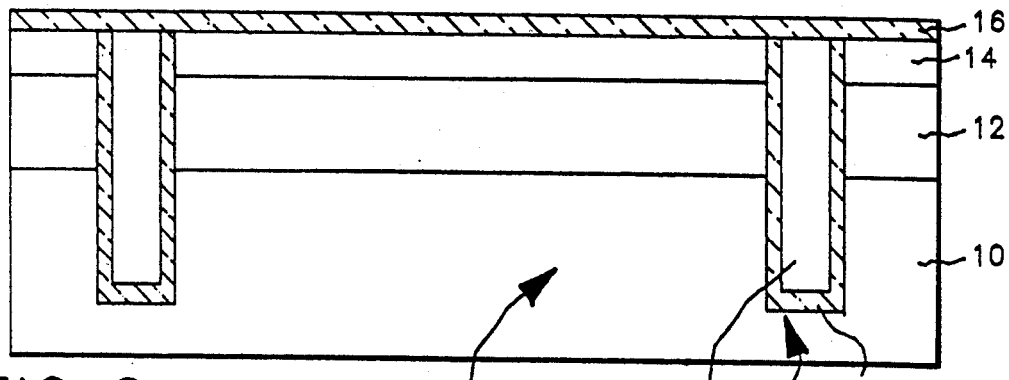

Referring now to FIG. 2, isolation trench 18 is formed to extend from the upper surface of layer 14 downward into substrate 10. Trench 18 includes an insulating liner 20, such as an oxide, and a filler material 22 such as intrinsic polysilicon. Many processes are known in the art for forming isolation trench 18, for example: 1) masking and etching to form an open well for the trench, 2) oxidizing the surface of the well to form oxide liner 20, 3) filling the lined well with polysilicon fill 22, 4) planarizing the polysilicon fill, and 5) submitting the structure to a thermal oxidation environment to oxidize the surface of polysilicon fill 22. See U.S. Pat. No. 4,104,086 by Bondur et. al. (assigned to the assignee of the present invention) for another teaching of forming an isolation trench. Trench 18 functions to electrically isolate a device region 24, consisting of registered portions of layers 10, 12, 14 bounded by the trench, within substrate 10.

Figure 3:
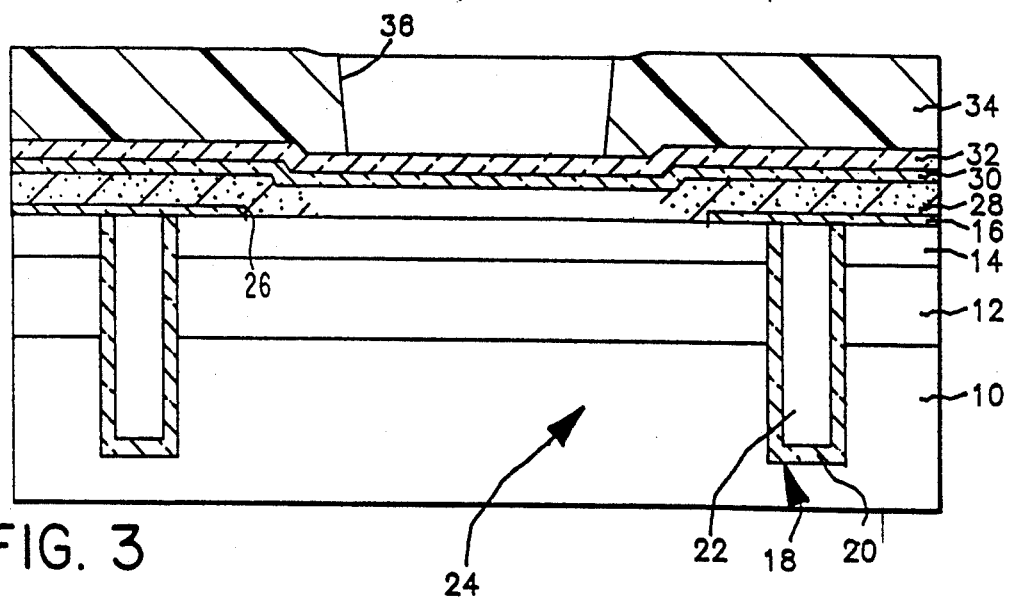

Referring now to FIG. 3, an aperture 26 is formed in oxide layer 16 by masking and etching the layer, so as to expose a portion of the surface of layer 14 over device region 24. A layer 28 of P+ polysilicon is formed conformally over the device to a thickness in the range of 300 nm. Polysilicon layer 28 is formed by a conventional CVD process, and can be formed in situ doped with a boron ion species, or can be subsequently implanted with the same type of ions.

Continuing with reference to FIG. 3, a layer 30 of silicon dioxide is formed over layer 28 to a thickness of 80 nm. A layer 32 of silicon nitride ($Si_3N_4$, also referred to as a nitride) is formed over layer 30 to a thickness of 150 nm. Oxide layer 30 and nitride layer 32 are both formed by a conventional CVD process.

Still with reference to FIG. 3, a layer 34 of photoresist is formed over the surface of layer 32, and patterned to provide an aperture 36 generally centered over device region 24. Many conventional photoresist materials and processes are known in the art, and the exact process used does not constitute a part of the present invention.

FIGS. 4-9 show an enlarged portion of the device around aperture 36 (FIG. 3) to better illustrate the present invention.

Figure 4:
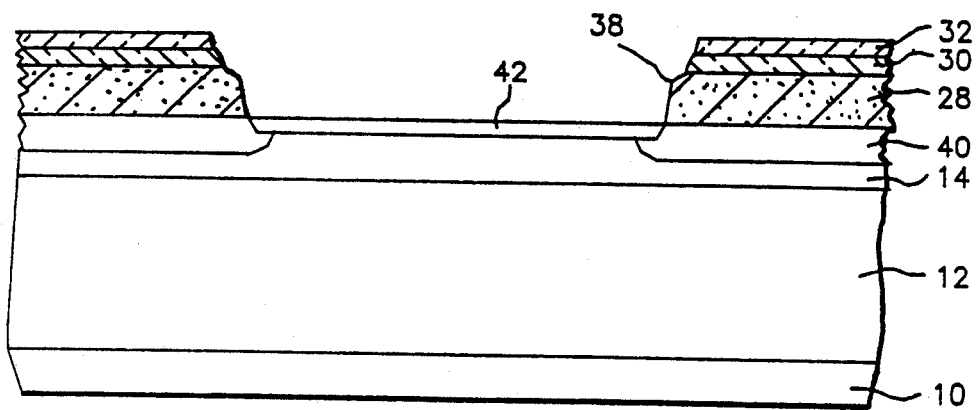

Referring now to FIG. 4, a multistep reactive ion etching (RIE) process has been used, utilizing patterned resist layer 34 (FIG. 3) as a mask, to form an aperture 38 through layers 32, 30, and 28, consecutively. Nitride layer 32 and oxide layer 30 are etched in CF4 plasma, while polysilicon layer 28 is etched using HBr/Cl2 plasma.

Continuing with reference to FIG. 4, the structure is subjected to a heating or annealing cycle so as to drive dopant from polysilicon layer 28 into epitaxial layer 14, whereby to form P+ extrinsic base region 40. Subsequent to this thermal treatment, a thin linking region 42 is formed in the surface of the exposed region of epitaxial layer 14. Linking region 42 is preferably formed by ion implantation of boron ions, at a dosage in the range of $2-4 \times 10^{13}$ ions/cm$^2$, and an energy in the range of 4-6 KeV, so as to yield the linker region with a dopant concentration in the range of $2-5 \times 10^{18}$ atoms/cm$^3$ and a thickness of about 100-200 nm. Linker region 42 is thus lower doped in comparison to extrinsic base region 40 (and to a subsequently formed intrinsic base region).

Photoresist 34 is removed in a conventional manner, for example by ashing.

Figure 5:
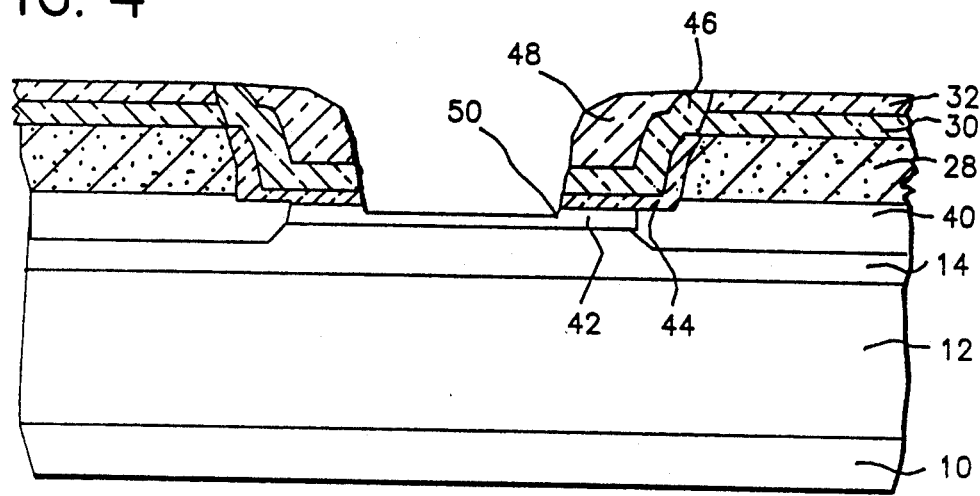

Referring now to FIG. 5, thermal oxidation is used to form a layer 44 of oxide, to a thickness of 50 nm, over the exposed surfaces of polysilicon layer 28, extrinsic base 40, and linker region 42. Next, a layer 46 of nitride is formed conformally over the structure by a process of CVD and to a thickness of 100 nm. CVD is further used to form a layer 48 of oxide conformally over layer 46 to a thickness of 250 nm.

Subsequent to the formation of layers 44, 46, and 48, the device is subjected to an anisotropic RIE etch using a Freon 13 plasma for layer 48, a $CF_4/O_2$ plasma for layer 46, and a $CF_4$ plasma for layer 44. The result of this etch is the insulating, multilayer (i.e. layers 44, 46, and 48) spacer shown in FIG. 5. In accordance with the present invention, the RIE etch described above is continued, using a $HBr/Cl_2$ plasma, for a distance in the range of 50-100 nm into the surface of linker region 42, forming recess 50 in the surface of linker region 42.

Figure 6:
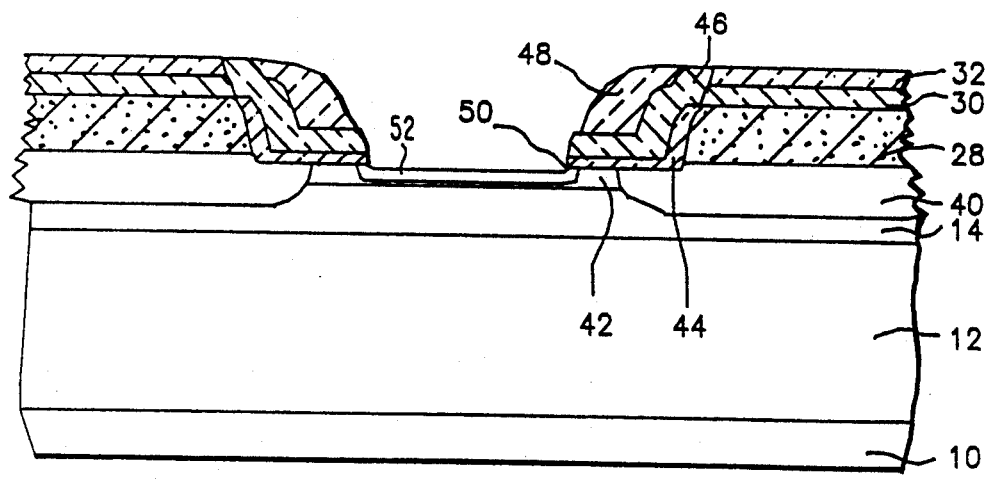

The above-described RIE etch to form recess 50 may result in damage, in the form of crystal lattice defects, to the surface of linker region 42. Referring now to FIG. 6, in order to cure this damage, the device is subjected to a thermal oxidation environment so as to oxidize the doped silicon surface exposed in recess 50, forming thermal oxide layer 52 to a thickness of about 50 nm. This oxidation process is performed at 700° C. and 10 ATM of pressure.

Figure 7:
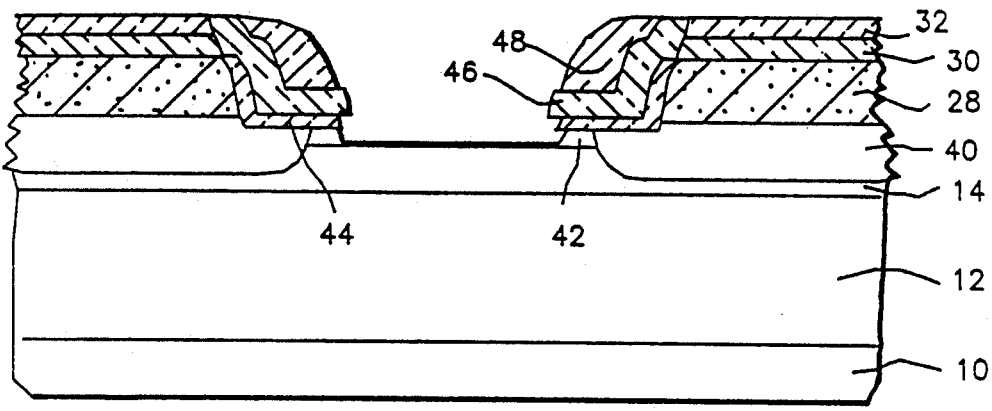

Referring now to FIG. 7, a wet etch, comprising, for example, BHF, is used to remove oxide layer 52 from the surface of recess 50. As a result of this wet etch, recess 50 extends in the range of 75-125 nm into the surface of linker region 42. This wet etch further functions to slightly etch back oxide layers 44 and 48 relative to nitride layer 46. This process of forming and removing oxide layer 52 functions to remove any defects in the surface of linker region 42 resulting from the above-described RIE process.

Figure 8:
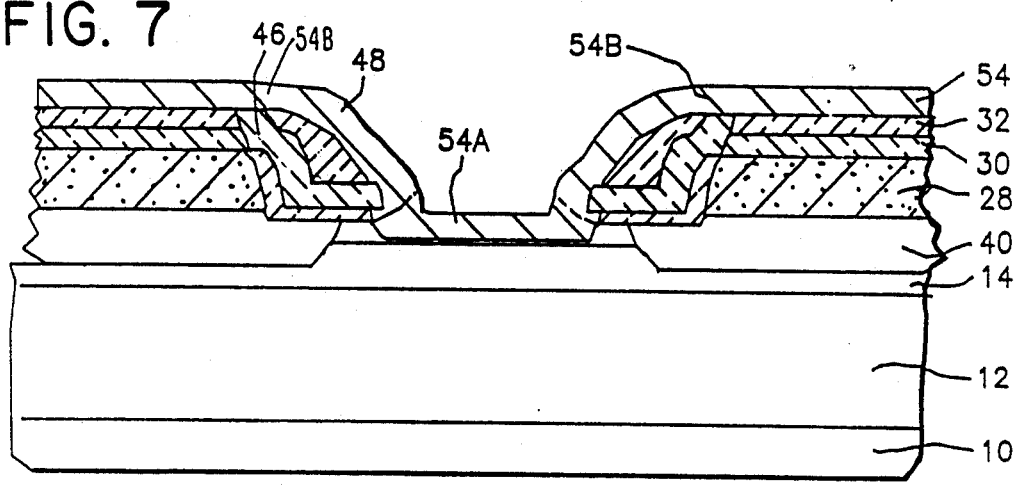

Referring now to FIG. 8, a layer 54 is deposited conformally over the structure so as to form a P type epitaxial silicon region 54A over linker region 42, and a P type polysilicon region 54B over the remainder of the device. In accordance with the present invention, layer 54 is formed using a low temperature, high vacuum CVD process of the type described in the Meyerson, et. al. reference cited herein above. For example, this low temperature epitaxial process can comprise subjecting the device to a gaseous mixture of $SiH_4/H_2$ and $B_2H_6$ (the dopant), in a flowing gaseous stream, at a temperature in the range of about 500-800 degrees centigrade, and a vacuum in the range of about $10^{-4}-10^{-2}$ torr during deposition. Layer 54 is thus formed to a thickness in the range of 50-100 nm. As is known in the art, this epitaxial process will form a single crystal structure 54A over single crystal substrate region 42, and a polycrystalline structure 54B over the remainder of the device.

The distribution of the $B_2H_6$ dopant is controlled during this process so as to provide layer 54 with a dopant concentration in the range of $3 \times 10^{18}-1 \times 10^{19}$, the dopant being more heavily concentrated towards the vertical center of the layer.

In accordance with another embodiment of the present invention, germanium (Ge) ions are introduced into the gaseous stream generated to form layer 54, for example through the use of $GeH_4$, so as to form a SiGe heterojunction at the interface between linker region 42 and epitaxial region 54A. The present invention, through the use of this low temperature process to form intrinsic base region 54A, is particularly well-suited to form such a heterojunction device.

Figure 9:
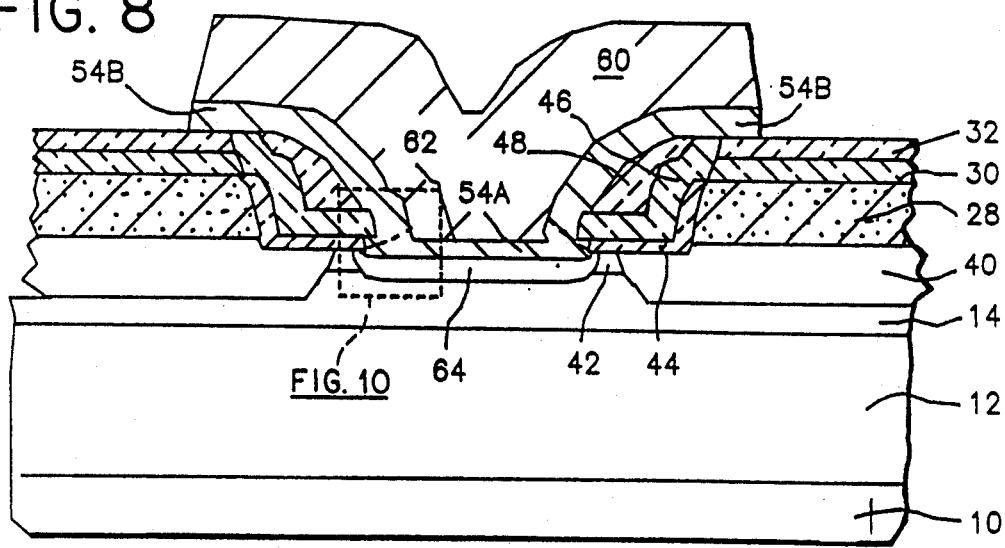
Figure 10:
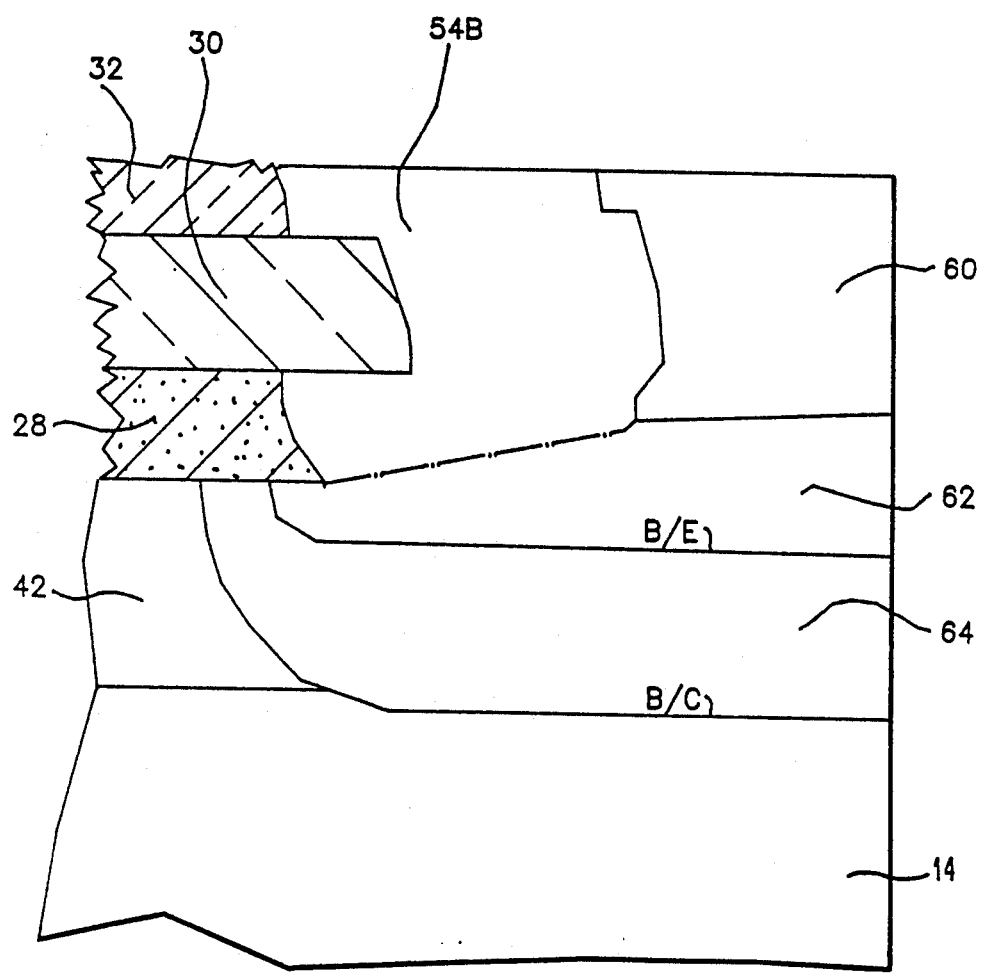
FIG. 10 is an enlarged view of a selected portion of FIG. 9.

FIG. 10 represents an enlarged view of the region of FIG. 9 enclosed in a dashed line.

Referring now to FIGS. 9 and 10, a layer 60 of intrinsic polysilicon is formed conformally over the device to a thickness of 200 nm. Polysilicon layer 60 is formed by a conventional CVD process. Layer 60 is then subjected to an ion implantation, using, for example, arsenic ions, to dope the polysilicon layer to N+.

Subsequent to the formation of polysilicon layer 60, the device is subjected to a heat or annealing cycle, for example at a temperature of 850° C. and for a duration of 30 minutes whereby to form the vertical bipolar transistor of FIGS. 9 and 10. As is best visible in FIG. 10, this thermal anneal functions to drive N dopant from polysilicon layer 60 into region 54A, forming N type emitter region 62. Substantially simultaneously, P type dopant from layer 54A diffuses downward while N type dopant from collector regions 12 and 14 diffuse upward to overcome linker region 42 beneath intrinsic base region 64. Emitter region 62 is thus formed in epitaxial layer 54A. Intrinsic base region 64, depending on the exact pre-anneal dopant concentration and profile and the exact thickness of epitaxial layer 54A, may be formed entirely within epitaxial region 54A, or may extend a short distance into layer 14 (in the manner shown). Intrinsic base region 64 has an ultra-thin, uniform width in the range of 30-80 nm. Polysilicon region 54B is overcome by N type dopant from layer 60, becoming part of the polysilicon emitter contact.

During the last-described thermal anneal, linker region 42 forms a reliable electrical connection linking extrinsic base region 40 with intrinsic base region 64. In contrast to the background references discussed above, emitter region 62 is contained entirely within intrinsic base region 64, with the base region having sufficient corner doping to inhibit punch-through defects between the emitter region and collector region 14.

Layers 60 and 54 are subsequently patterned, using a conventional RIE process, to define the regions shown in FIG. 9. In a conventional manner, metal contacts (not shown) are provided to polysilicon emitter region contact 60, polysilicon extrinsic base contact 28, and to collector region 12. A conventional, highly-doped reachthrough region (not shown) can be used to complete the electrical connection to buried collector region 12.

There is thus provided a vertical bipolar transistor, and a method of making the same. The transistor has an ultra-thin, highly uniform intrinsic base region, permitting switching speeds estimated to be in the 40-80 GHz range. Further, a reliable electrical link is provided between the intrinsic and extrinsic base regions. The emitter region is fully contained within the intrinsic base region, inhibiting emitter-collector punch-through. The method of manufacturing the transistor utilizes low-temperature processes to form the critical, ultra-thin intrinsic base region, providing a well-controlled junction profile. This low-temperature process is also particularly useful for forming a SiGe heterojunction device. The present invention has application with respect to the formation of vertical bipolar transistors, and particularly with respect to the formation of such transistors for very large scale integrated circuit (VLSIC) devices.

While the invention has been shown and described with respect to specific embodiments, it is not thus limited. Numerous modifications, changes and improvements within the scope of the invention will occur to those skilled in the art.

What is claimed is:

1. A vertical bipolar transistor comprising:
   a semiconductor substrate including a first device region of a first conductivity type;
   a recess in a surface of said first device region;
   an epitaxial layer disposed in said recess;
   an intrinsic base region of a second conductivity type disposed at least partially within said epitaxial layer;
   a second device region of said first conductivity type disposed in a surface of said epitaxial layer and contained entirely within said intrinsic base region;
   a highly doped extrinsic base region of said second conductivity type disposed in said substrate and spaced from said intrinsic base region; and
   a linking region of said second conductivity type disposed intermediate said intrinsic and extrinsic base regions so as to electrically connect said intrinsic and extrinsic base regions, wherein said linking region has a relatively lighter doping concentration than said extrinsic and intrinsic base regions.

2. The vertical bipolar transistor of claim 1 and further including a conductive extrinsic base contact disposed on a surface of said substrate over said extrinsic base region.

3. The vertical bipolar transistor of claim 2 and further including a conductive contact disposed on a surface of said second device region.

4. The vertical bipolar transistor of claim 3 and further including an insulating spacer comprising at least one layer of inorganic insulating material disposed intermediate said conductive extrinsic base contact and said conductive contact to said second device region.

5. The vertical bipolar transistor of claim 1 wherein said epitaxial layer is of a generally uniform thickness in the range of 50–100 nm.

* * * * *